United States Patent [19]

Sasaki et al.

[11] 4,322,736
[45] Mar. 30, 1982

[54] SHORT-RESISTANT CONNECTION OF POLYSILICON TO DIFFUSION

[75] Inventors: Isao Sasaki; Nobuaki Hotta; Tohru Tsujide, all of Tokyo, Japan

[73] Assignee: Nippon Electric Co., Ltd., Tokyo, Japan

[21] Appl. No.: 62,435

[22] Filed: Jul. 30, 1979

[30] Foreign Application Priority Data

Jul. 28, 1978 [JP] Japan .................................. 53-92827

[51] Int. Cl.³ ........................................... H01L 27/04
[52] U.S. Cl. ....................................... 357/59; 357/42; 357/68; 357/86
[58] Field of Search ........................ 357/59, 42, 48, 68, 357/86, 40

[56] References Cited

U.S. PATENT DOCUMENTS

| | | | |
|---|---|---|---|
| 3,750,268 | 8/1973 | Wang | 357/59 |
| 3,812,521 | 5/1974 | Davis | 357/68 |
| 3,891,190 | 6/1975 | Vadasz | 357/59 |
| 4,033,797 | 7/1977 | Dill et al. | 357/59 |
| 4,041,522 | 8/1977 | Oguey et al. | 357/59 |
| 4,143,388 | 3/1979 | Esaki et al. | 357/59 |
| 4,205,330 | 5/1980 | Klein | 357/42 |

*Primary Examiner*—William D. Larkins

*Attorney, Agent, or Firm*—Sughrue, Mion, Zinn, Macpeak & Seas

[57] ABSTRACT

A semiconductor device having a contact structure which does not lose the merit of high density circuit integration and yet can suppress generation of a leakage current is disclosed. In its basic form, the semiconductor device comprises a semiconductor substrate of one conductivity type having a first region of opposite conductivity type extending from one major surface of the semiconductor substrate to the interior of the substrate. A semiconductor layer extends on the semiconductor substrate via a first insulating film from a contact with the one major surface of the semiconductor substrate outside the first region of opposite conductivity type to a point immediately adjacent the first region. A second insulating film covers the first region of opposite conductivity type and the semiconductor layer. An aperture formed in the second insulating film exposes a portion of the first region of opposite conductivity type and a portion of the semiconductor layer close to the first region portion. A metallic layer is provided within the aperture and connects the first region of opposite conductivity type and the semiconductor layer. A second region of opposite conductivity type is provided along the entire surface portion of the semiconductor substrate under the semiconductor layer at the aperture and adjacent to the first region of opposite conductivity type.

8 Claims, 11 Drawing Figures

SHORT-RESISTANT CONNECTION OF POLYSILICON TO DIFFUSION

BACKGROUND OF THE INVENTION

The present invention relates to a semiconductor device, and more particularly to a semiconductor device having a contact structure in which a polycrystalline silicon wiring layer and an impurity region in a semiconductor substrate are connected via a metallic layer.

In the case where a polycrystalline silicon wiring layer and an impurity region are of the same conductivity type, ohmic connection can be made directly between the polycrystalline silicon wiring layer and the impurity region. However, in the case where a polycrystalline silicon wiring layer and an impurity region are of opposite conductivity type to each other, then direct connection cannot be made therebetween, and hence connection must be made via a metallic layer. Especially, in complementary insulated-gate field effect transistors (hereinafter called CMOS), a polycrystalline silicon wiring layer connected directly to a source or drain region of one of the transistors must be connected via a metallic layer to a source or drain of the other transistor.

In this case, if an aperture is formed in an insulating film covering the impurity region and the polycrystalline silicon wiring layer so as to overlap both the impurity region and the polycrystalline silicon wiring layer, and if a metallic layer is provided in this aperture to form a contact structure for bridging the impurity region and the polycrystalline silicon layer by being separately connected to the impurity region and the polycrystalline silicon wiring layer, then the arrangement is advantageous for realizing a high density in an integrated circuit because a wiring area can be made small. However, when the aperture is formed in the insulating film on the polycrystalline silicon wiring layer, an etching liquid such as hydrofluoric acid would penetrate through the grain boundaries of the polycrystalline silicon, resulting in generation of pin holes in an insulating film lying right under the polycrystalline silicon wiring layer, and consequently, there has been a problem that a leakage current is apt to occur between the substrate and the aforementioned conductor. Therefore, in a CMOS integrated circuit memory of 4 Kbits, for example, there exists a problem that an information holding current upon a stand-by state is greatly increased to several microamperes or several milliamperes as compared to about 10 nA or lower in a normal case.

SUMMARY OF THE INVENTION

It is one object of the present invention to provide a semiconductor device having a contact structure which does not lose the merit of high density circuit integration and yet can suppress generation of a leakage current.

According to one feature of the present invention, there is provided a semiconductor device comprising a semiconductor substrate of one conductivity type, a first region of opposite conductivity type extending from one major surface of said semiconductor substrate to the interior of the substrate, a semiconductor layer extending on said semiconductor substrate via a first insulating film, a second insulating film covering said first region of said opposite conductivity type and said semiconductor layer, an aperture formed in said second insulating film so as to expose a portion of said first region of said opposite conductivity type and a portion of said semiconductor layer close to said first region portion, a metallic layer provided within said aperture so as to connect to said first region of said opposite conductivity type and said semiconductor layer, respectively, and a second region of said opposite conductivity type provided along the entire surface portion of the semiconductor substrate under said semiconductor layer at said aperture and adjacent to said first region of said opposite conductivity type.

According to another feature of the present invention, there is provided a semiconductor device comprising a pair of source and drain regions provided within a region of one conductivity type in a semiconductor substrate and having opposite conductivity type, another pair of source and drain regions of said one conductivity type provided within a region of said opposite conductivity type in said semiconductor substrate, a polycrystalline silicon wiring layer of said one conductivity type extending over a first insulating film on a major surface of said semiconductor substrate so as to be connected at a first end portion to one of said source and drain regions of said one conductivity type and to come at a second end portion close to one of said source and drain regions of said opposite conductivity type, a second insulating film provided on said one region of said opposite conductivity type and on said polycrystalline silicon wiring layer, an aperture formed in said second insulating film so as to expose a predetermined portion of said one region of said opposite conductivity type and a predetermined portion of said polycrystalline silicon wiring layer, a conductive layer provided within said aperture to be connected to the predetermined portion of said one region of said opposite conductivity type and the predetermined portion of said polycrystalline silicon wiring layer, respectively, and a region of said opposite conductivity type provided in the entire surface portion of said semiconductor substrate right under said predetermined portion of said polycrystalline silicon wiring layer.

With regard to the aforementioned region of opposite conductivity type, after a thick field oxide layer surrounding an active region has been formed, it can be preliminarily provided on the surface of the semiconductor substrate including the active region, adjacent to the field oxide layer.

Also, the region of opposite conductivity type can be formed by ion-injection after the aperture has been formed.

Generally, the conductivity type of the semiconductor layer or silicon layer is opposite to that of the impurity region or the first region to which the silicon layer is connected via a metalic layer. However, the silicon layer, the first region and the second region of the present invention may be the same conductivity type each other.

As described above, a leakage current can be extremely reduced, by providing an impurity region of opposite conductivity type to a semiconductor substrate, in the semiconductor substrate right under a semiconductor layer or a polycrystalline silicon wiring layer at an aperture. In a CMOS memory, while rejected devices due to increase of an information holding current upon a stand-by state occured at a proportion of 20% in the case of not applying the present invention, the proportion can be reduced to 1.5% by providing the impurity region according to the present invention. The rejected devices at the proportion of 1.5% are those inevitably produced in the up-to-date manufacturing process of semiconductor devices, and hence the effect of preventing a leakage of the structure according to the present invention can be deemed perfect.

DESCRIPTION OF PREFERRED EMBODIMENTS

Figure 1:
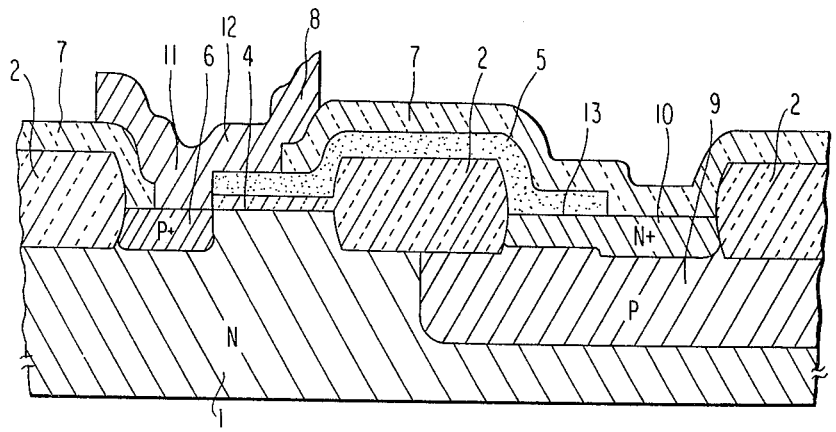
FIG. 1 is a cross-sectional view showing a portion of a CMOS in the prior art.

One example of a CMOS in the prior art is schematically shown in FIG. 1. In an N-type substrate 1 having an impurity concentration of $1 \times 10^{15}$ atoms/cm$^3$ is formed a P-type region (P-well) 9 of 6 μm in thickness having an impurity concentration of $1 \times 10^{16}$ atoms/cm$^3$, and a thick field oxide layer 2 of about 1 μm in thickness is selectively provided on the substrate 1. In the N type region of this substrate 1 is provided a P type region 6 having an impurity concentration of $1 \times 10^{20}$ atoms/cm$^3$, which region is used as a drain region 6 of a P channel transistor, and on the other hand, in the P-type region 9, that is, in the P-well 9 of the substrate 1 is provided an N-type region 10 having an impurity concentration of $1 \times 10^{21}$ atoms/cm$^3$, which region is used as a drain region 10 of an N-channel transistor. In a CMOS, these drain regions 6 and 10 are connected in common to be used as an output of the CMOS. As this common connection means, there is provided an N-type polycrystalline silicon wiring layer 5 of about 4000 Å in thickness containing phosphorus at a concentration of $1 \times 10^{21}$ atoms/cm$^3$, which connects to the N-type drain region 10 at a surface portion 13 and extends over the field oxide layer 2 and on a thin silicon oxide film 4 of 500 Å in thickness (this serves as a gate oxide film at a gate section) up to the proximity of the P-type drain region 6, and these wiring layer 5 and P-type drain region 6 are connected to each other by means of a matallic wiring layer 8 made of aluminum or the like. Generally, in the manufacturing process of the CMOS having the above-mentioned construction, the P-type drain region 6 is formed after the N-type polycrystalline silicon wiring layer 5 has been selectively provided, and therefore, no P type region is formed in the portion of the N-type substrate right under the wiring layer 5. Subsequently, the entire surface has been coated with a CVD silicon oxide film 7, an aperture 11 is formed on the P-type drain region 6, and also an aperture 12 is formed on the polycrystalline silicon wiring layer 5 adjacent to this aperture 11. In other words, an aperture overlapping both the P-type drain region 6 and the polycrystalline silicon wiring layer 5 is formed, and in this aperture is provided a metallic wiring layer 8. However, as described previously, such a structure has a problem that when the aperture 12 is formed in the CVD slicon oxide film 7 on the polycrystalline silicon wiring layer 5, an etching liquid would penetrate through the grain boundaries of the polycrystalline silicon wiring layer 5, resulting in generation of pin holes in the thin insulating film 4 right under the polycrystalline silicon wiring layer 5, and consequently a leakage current is apt to occur between the substrate and the aforementioned conductors.

FIRST PREFERRED EMBODIMENT

Figure 2A:
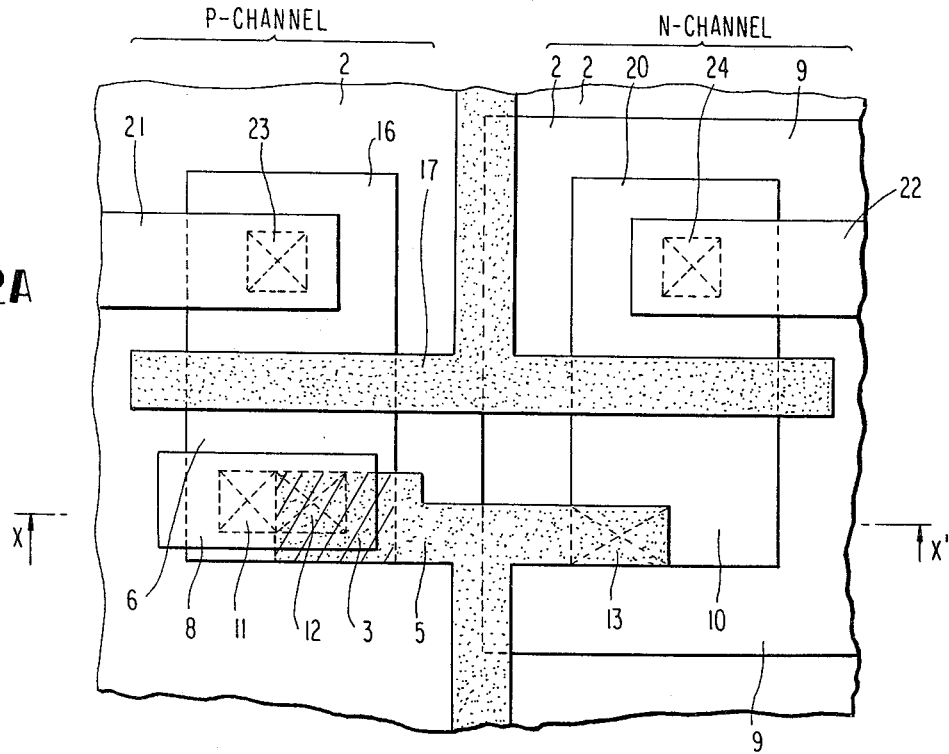
FIG. 2A is a plan view showing a CMOS according to a first preferred embodiment of the present invention.
Figure 2B:
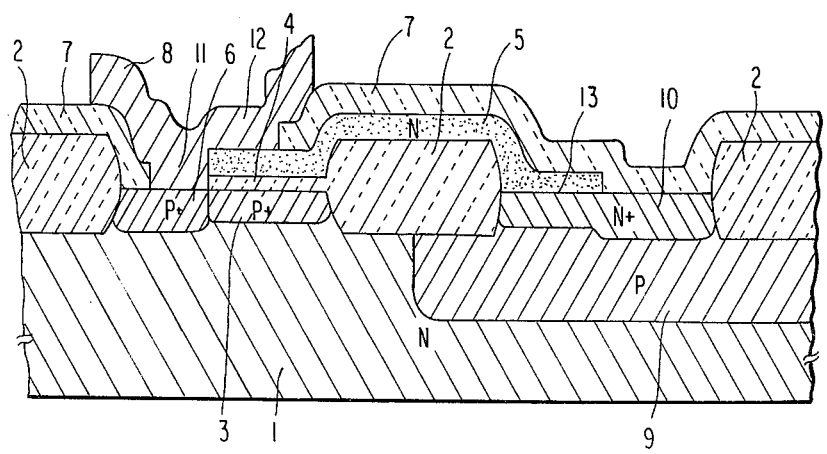
FIG. 2B is a cross-sectional view taken along line X-X' in FIG. 2A as viewed in the direction of arrows.
Figure 6:
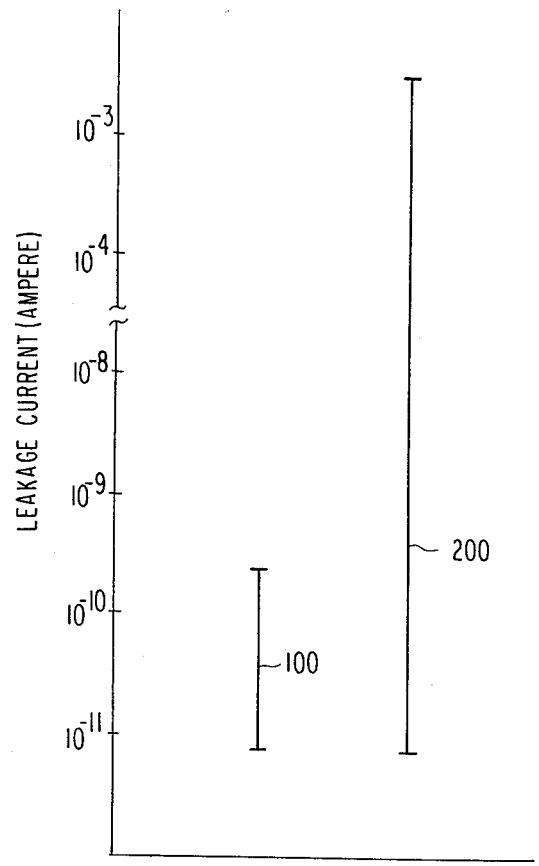
FIG. 6 is a diagram showing leakage currents in the device according to the present invention and in the device in the prior art to illustrate the effect of the present invention.

A first preferred embodiment of the present invention is illustrated in FIGS. 2A and 2B, in which items having the same functions as those shown in FIG. 1 are designated by like reference numerals. A P-type source region 16 of a P-channel transistor is connected at a contact section 23 to a metallic wiring layer 21, whereas an N-type source region 20 of an N-channel transistor is connected at a contact section 24 to a metallic wiring layer 22. A common gate electrode 17 is formed of N-type polycrystalline silicon and serves as an input electrode for this CMOS. The present invention exists in the portion of connecting the drain regions 6, 10 of these respective transistors. More particularly, with reference to FIG. 2B a P-type region 3 of the present invention is provided in the entire portion of the semiconductor substrate right under an aperture 12 in a polycrystalline silicon wiring layer 5. This additional P-type region has, according to the illustrated embodiment, an impurity concentration of $1 \times 10^{18}$ atoms/cm$^3$ and a depth of 0.3 to 1.0 μm, and is located adjacent to the P-type drain region 6. Explaining the above-mentioned arrangement with reference to the plan view in FIG. 2A, a dotted area represents the N-type polycrystalline silicon wiring layer 5, and this wiring layer 5 is connected to a metallic wiring layer 8 at an aperture 12 having an area of 5 μm × 6 μm which is represented by a dash-line crossed rectangle. Under this aperture 12 is formed a P-type region 3 having a hatched area of 10 μm × 7 μm so as to extend over the entire area right under the aperture 12. By the provision of the additional P-type region 3, the first described problem in the prior art can be eliminated. The effect achieved by the aforementioned embodiment of the present invention is illustrated in FIG. 6. With reference to FIG. 6, a leakage current in the semiconductor device according to the present invention is represented by a data line 100 which is limited to within the range of about $10^{-10} \sim 10^{-11}$ ampere, whereas in the prior art semiconductor device in which the additional P-type region 3 is not present, the leakage current varies in the range of about $10^{-3} \sim 10^{-11}$ ampere as shown by a data line 200. The data of FIG. 6 are of test elements which have two hundred contact portions.

Figure 3A:
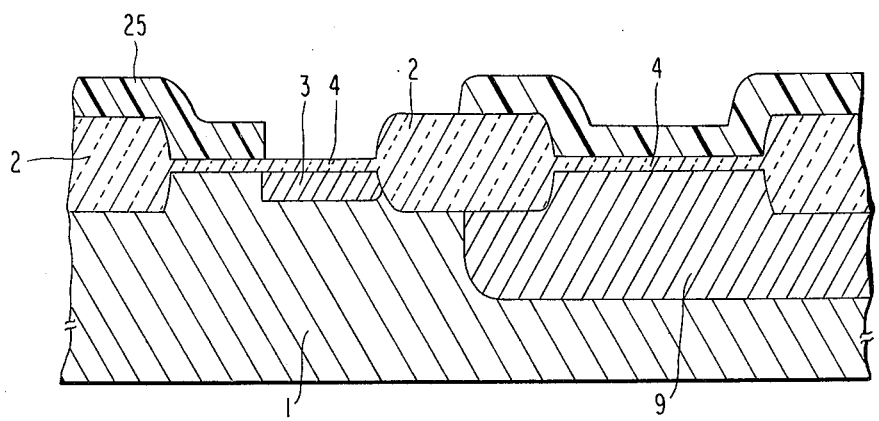
FIGS. 3A, 3B and 3C are cross-sectional views showing the successive steps in the manufacturing process according to the first preferred embodiment of the present invention.
Figure 3B:
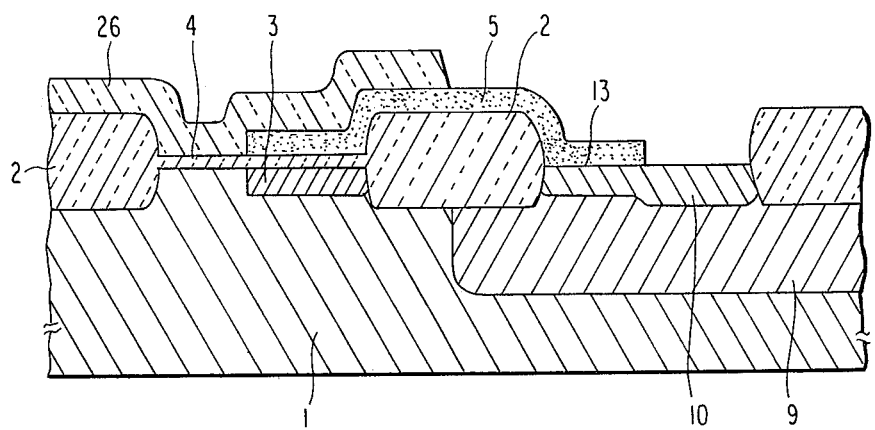
Figure 3C:
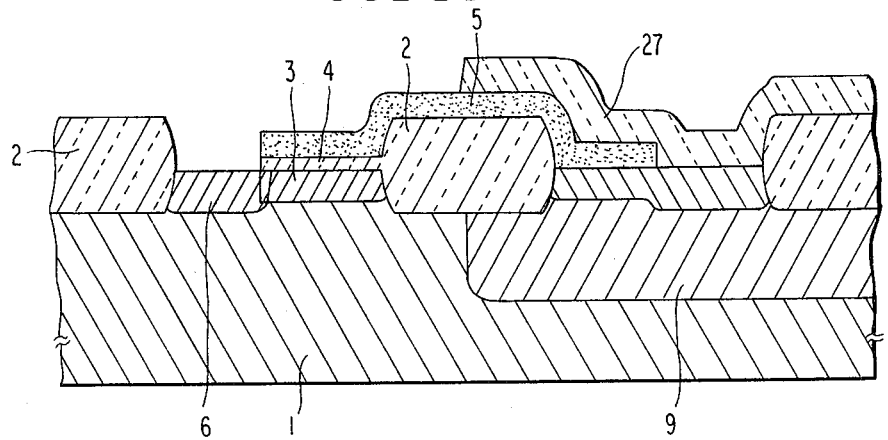

Now the process for manufacturing the semiconductor device according to the present invention will be briefly described with reference to FIGS. 3A to 3C. Referring to these figures, after the P well 9 has been formed and a field oxide film 2 has been selectively provided, ion injection of boron is effected under the condition of 100~150 KeV and $1\times10^{13}$ atoms/cm$^2$ through a thin oxide film 4 by masking with a photoresist 25, and thereby the P-type region 3 according to the present invention can be formed (FIG. 3A).

Subsequently, the oxide film 4 at the contact section of the N-channel transistor is removed, then a polycrystalline silicon layer 5 doped with phosphorus is vapor-grown, and after patterning, it is formed into a wiring layer 5. Then the P-channel transistor section is coated with a silicon nitride film 26, and thereafter the source region 20 (FIG. 2A) and the drain region 10 of the N-channel transistor are formed by diffusion or ion injection of phosphorus (FIG. 3B).

Next, the N channel transistor section is coated with a silicon nitride film 27, and thereafter the source region 16 (FIG. 2A) and the drain region 6 of the P channel transistor having the impurity concentration of $10^{20}$ atoms/cm$^2$ or lower are formed by diffusion or ion injection of boron. During this step of the process, the drain region 6 and the P-type region 3 are surely connected to each other by diffusion in the lateral direction (FIG. 3C). It is to be noted that during this step of the process, while the polycrystalline silicon layer 5 on the side of the P-channel transistor is not coated with the silicon nitride film 27, the layer 5 remains as an N-type layer even if boron is introduced therein during this step. Because the polycrystalline silicon layer 5 has been preliminarily doped with phosphorus at a high concentration of $1\times10^{21}$ atoms/cm$^3$, and the source, drain regions 16, 6 are formed up to $10^{20}$ atoms/cm$^3$. Since there exists such a concentration difference, the boron injection into the layer 5 in FIG. 3C process is compensated by the phosphorus. Then the entire device is coated with a CVD oxide film 7, apertures 11 and 12 are formed in the oxide film 7, and a metallic wiring layer 8 is provided in these apertures as shown in FIG. 2B. In the process for manufacture of the semiconductor device in the prior art, the step shown in FIG. 3A is not included and the process starts from the step shown in FIG. 3B, and hence the P-type region 3 according to the present invention cannot be formed.

According to the above-mentioned embodiment of the present invention, when the aperture 12 is formed in the insulating film 7 above the polycrystalline silicon wiring layer 5, even if the polycrystalline silicon layer 5 and an underlying thin insulating film 4 should be etched or eroded by an etching liquid then used, generation of a leakage current between the substrate 1 and the metallic wiring layer 8 could be prevented because the region 3 of the opposite conductivity type to the substrate 1 is formed right under the insulating film 4.

As will be apparent from the above explanation, a polycrystalline silicon wiring layer and a diffused layer can be connected with another conductor without losing the merit of the high density circuit integration.

While an N-type substrate was employed in the above-described embodiment, the present invention can be equally embodied in the case of a P-type substrate. Furthermore the silicon wiring layer need not be made of polycrystalline silicon, but it could be made of amorphous, porous or other silicon.

SECOND PREFERRED EMBODIMENT

Figure 4:
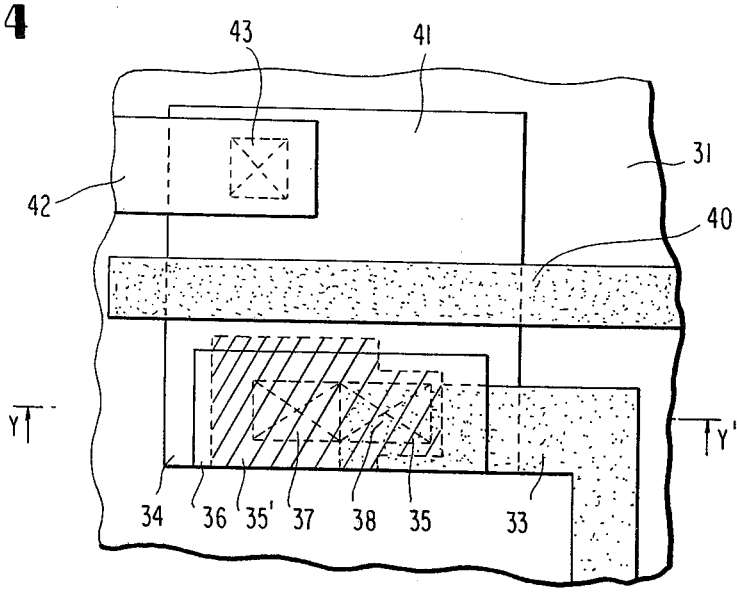
FIG. 4 is a plan view showing a second preferred embodiment of the present invention.
Figure 5A:
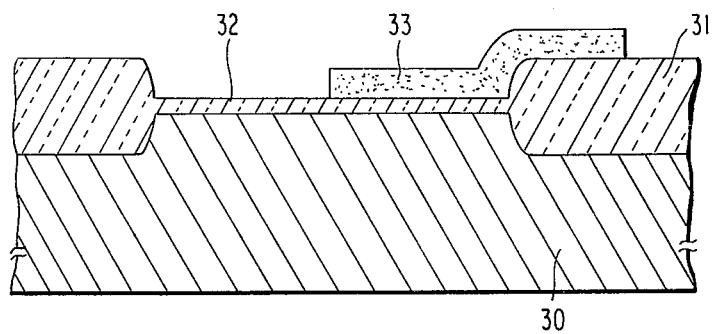
FIGS. 5A, 5B and 5C are cross-sectional views taken along line Y-Y' in FIG. 4 as viewed in the direction of arrows, showing the successive steps in the manufacturing process according to the second preferred embodiment of the present invention.
Figure 5B:
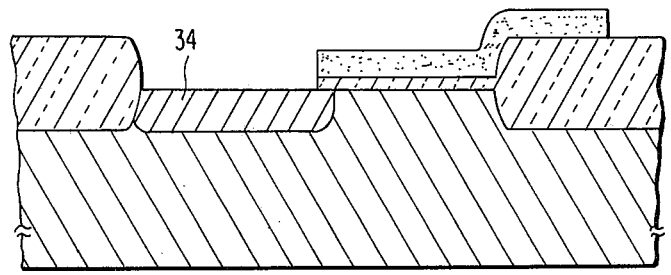
Figure 5C:
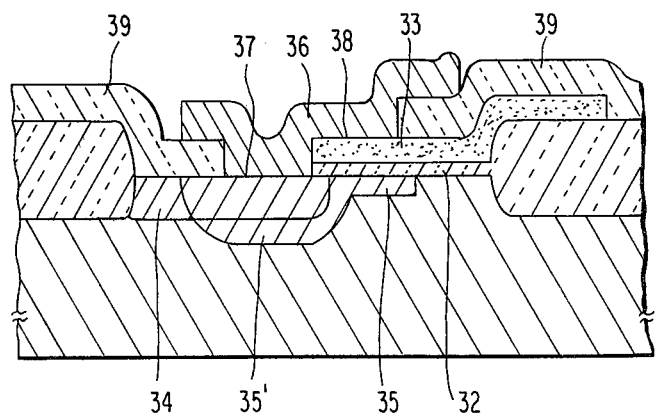

A process for manufacture of a semiconductor device according to a second preferred embodiment of the present invention is illustrated in cross-sectional in FIGS. 5A to 5C, and a plan view of the device in the step illustrated in FIG. 5C is shown in FIG. 4.

At first, as shown in FIG. 5A, after a thick field oxide film 31 and a gate insulating film 32 have been formed on an N-type monocrystalline silicon substrate 30 by thermal oxidation, a non-doped polycrystalline silicon layer 33 is selectively formed on these films by vapor growth.

Subsequently, as shown in FIG. 5B, the insulating film 32 is etched by employing the polycrystalline silicon layer 33 as a mask for etching. Thereafter, a P-type region 34 is formed by doping a P-type impurity into the substrate 30 through an ion-injection or thermal diffusion process by employing the field oxide film 31 and the polycrystalline silicon layer as a mask, and at the same time the P-type impurity is added to the polycrystalline silicon layer 33. Up to this step, the process does not differ at all from the process for manufacture of the conventional P-channel silicon gate MOS integrated circuit.

Next, as shown in FIG. 5C, after an insulating film 39 has been deposited on the surface of the substrate, in order to conductively connect a metallic conductor to the polycrystalline silicon 33 and the P type region 34, the insulating film 39 is selectively etched to form contact apertures 37 and 38, and thereby a part of the P-type region 34 and a part of the polycrystalline silicon layer 33 are selectively exposed. Thereafter, boron is doped by ion-injection to form a P-type region 35' in the surface portion of the silicon substrate 30 at the contact aperture 37 and at the same time to form a P-type region 35 in the surface portion of the silicon substrate 30 right under the polycrystalline silicon layer 33 or right under the aperture 38.

Then an aluminum layer 36 is selectively deposited on the P-type regions 34 and 35' in the surface portion of the substrate 30 and on the polycrystalline silicon layer 33 exposed from the insulating film 39, and thereby electrically connects the region and layer to each other.

According to the above-described embodiment of the present invention, a P-type region 35 is formed in the surface portion of the substrate right under the contact aperture section of the polycrystalline silicon layer 33, so that the generation of the above-described leakage current can be prevented, and also, by forming a P type region 35' deeper than a P type region 34 to be used as a diffused wiring layer, the device can be made to have a structure that is more hardly invaded by alloy spikes generated in the surface portion of the substrate at the contact aperture section. Furthermore, the P-type regions 35 and 35' can be made to have a lower concentration than the P-type region 34, so that a capacitance of a diffusion region right under the contact aperture section can be reduced.

It is to be noted that according to the above-described embodiment of the present invention, despite of the fact that a buried contact photo-etching process that is necessitated in the case of the so-called buried contact process is unnecessary, it requires only an occupation area equal to or less than the buried contact as shown in the plan view in FIG. 4, and therefore, the present invention is greatly effective in high density circuit integration as well as in simplification of a process.

Explaining the above-described arrangement with reference to the plan view in FIG. 4, to a source region 41 is connected to a metallic wiring layer 42 via a contact section 43, and a gate electrode 40 is formed of polycrystalline silicon. The P-type regions 35 and 35' provided according to the present invention is indicated by a hatched area, and these P-type regions are formed so as to extend over the entire portion of the N-type substrate underlying the aperture 38 indicated by a dash-line crossed rectangle on the polycrystalline silicon layer 33 that is indicated by a dotted area. The lateral extension of these regions 35 and 35' beyond the apertures 37 and 38 with respect to their plan configuration is caused by diffusion in the lateral direction, and this is similar to the above-described first preferred embodiment.

According to this second preferred embodiment, the thickness of the polycrystalline silicon layer 33 is 4000 Å, the thickness of the underlying thin oxide film 32 (this film serving as a gate oxide film at the gate section) is 500 Å, the thickness of the silicon oxide film 39 formed through CVD is about 1 μm, and if boron is injected at 130~220 KeV, for example, at 150 KeV, then the P type region 35 under the aperture 38 is formed up to a depth of about 0.5 μm, while the P-type region 35' under the aperture 37 is formed up to a depth of about 1.0 μm. Alternatively, if the conductivity types are reversed in this preferred embodiment and an N-type region is to be formed in a P-type substrate, then ion injection of phosphorus is effected at 300~600 KeV, for example, at 350 KeV. Also, in this case the ion injection could be effected while retaining the photoresist used upon forming the apertures.

While a non-doped silicon layer was employed in the FIG. 5A process of the second embodiment, P-type or N-type silicon layers can be equally employed. When the polycrystalline silicon layer 33 has been preliminarily doped with phosphorus at a high concentration of, for example, $5 \times 10^{20}$ atoms/cm$^3$ or higher, the P-type regions 35 and 35' are formed by ion injection of boron up to a concentration of $1 \times 10^{17} \sim 1 \times 10^{19}$ atoms/cm$^3$. Since there exists such a concentration difference, the boron injected into the N-type polycrystalline silicon layer 33 is compensated by the phosphorus and hence the polycrystalline silicon layer 33 remains as an N-type layer.

We claim:

1. A semiconductor device comprising a semiconductor substrate of one conductivity type, a first region of opposite conductivity type extending from one major surface of said semiconductor substrate to the interior of the substrate, a semiconductor layer of said one conductivity type extending over said semiconductor substrate via a first insulating film, a second insulating film covering said first region of said opposite conductivity type and said semiconductor layer, an aperture formed in said second insulating film so as to expose a portion of said first region of said opposite conductivity type and a portion of said semiconductor layer close to said first region portion, a metallic layer provided within said aperture so as to connect said first region of said opposite conductivity type and said semiconductor layer, respectively, and a second region of said opposite conductivity type provided along the surface portion of the semiconductor substrate under said semiconductor layer at said aperture and adjacent to said first region of said opposite conductivity type.

2. A semiconductor device of claim 1, in which said semiconductor layer is an polycrystalline silicon layer.

3. A semiconductor device of claim 1, in which an edge of said first region and an edge of said semiconductor layer lie in said aperture and are substantially coincident with each other.

4. A semiconductor device comprising a pair of source and drain regions provided within a region of one conductivity type in a semiconductor substrate and having an opposite conductivity type, another pair of source and drain regions of said one conductivity type provided within a region of said opposite conductivity type in said semiconductor substrate, a polycrystalline silicon wiring layer of said one conductivity type extending over a first insulating film on a major surface of said semiconductor substrate so as to be connected at a first end portion to one of said source and drain regions of said one conductivity type and to come at a second end portion close to one of said source and drain regions of said opposite conductivity type, a second insulating film provided on said one region of said opposite conductivity type and on said polycrystalline silicon wiring layer, an aperture formed in said second insulating film so as to expose a predetermined portion of said one region of said opposite conductivity type and a predetermined portion of said polycrystalline silicon wiring layer, a metallic layer provided within said aperture to be connected to said predetermined portion of said one region of said opposite conductivity type and said predetermined portion of said polycrystalline silicon wiring layer, respectively, and a region of said opposite conductivity type provided in the entire surface portion of said semiconductor substrate right under said predetermined portion of said polycrystalline silicon wiring layer.

5. A semiconductor device comprising a semiconductor substrate of one conductivity type, a first region of opposite conductivity type extending from one major surface of said semiconductor substrate to the interior of the substrate, a semiconductor layer of said one conductivity type extending over said semiconductor substrate via a first insulating film, a second insulating film covering said first region of said opposite conductivity type and said semiconductor layer, an aperture formed in said second insulating film so as to expose a portion of said first region of said opposite conductivity type and a portion of said semiconductor layer close to said first region portion, a metallic layer provided within said aperture so as to connect said first region of said opposite conductivity type and said semiconductor layer, respectively, and a second region of said opposite conductivity type provided along the surface portion of the semiconductor substrate under said semiconductor layer at said aperture and adjacent to said first region of said opposite conductivity type, said semiconductor layer being physically separated from said first and second regions of said opposite conductivity type.

6. A semiconductor device of claim 5, in which said semiconductor layer is a polycrystalline silicon layer.

7. A semiconductor device of claim 5, in which an edge of said first region and an edge of said semiconductor layer lie in said aperture and are substantially coincident with each other.

8. A semiconductor device comprising a first semiconductor region of one conductivity type, a second region of the opposite conductivity type formed in said first semiconductor region, an insulator film covering a peripheral surface of said second region and the surface of a portion of said first semiconductor region adjacent to said second region, a semiconductor layer of said one conductivity type formed on said insulator film and separated from said first and second regions by said insulator film, means for electrically connecting said semiconductor layer with said second region, and a third region of the opposite conductivity type formed adjacent to said second region in said first semiconductor region and under a portion of said insulator film on which said semiconductor layer is present.

* * * * *